(12) United States Patent
Hutter et al.

(10) Patent No.: US 9,285,448 B2
(45) Date of Patent: Mar. 15, 2016

(54) ITERATIVE RECONSTRUCTION METHOD WITH PENALTY TERMS FROM EXAMINATION OBJECTS

(75) Inventors: Jana Hutter, Effeltrich (DE); Peter Schmitt, Weisendorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 679 days.

(21) Appl. No.: 13/591,643

(22) Filed: Aug. 22, 2012

(65) Prior Publication Data

US 2013/0049754 A1 Feb. 28, 2013

(30) Foreign Application Priority Data

Aug. 23, 2011 (DE) .......................... 10 2011 081 413

(51) Int. Cl.
| | |
|---|---|
| *G06K 9/00* | (2006.01) |
| *G01R 33/34* | (2006.01) |
| *G01R 33/561* | (2006.01) |
| *G01R 33/56* | (2006.01) |
| *G01R 33/563* | (2006.01) |

(52) U.S. Cl.
CPC .......... *G01R 33/561* (2013.01); *G01R 33/5608* (2013.01); *G01R 33/5611* (2013.01); *G01R 33/5635* (2013.01)

(58) Field of Classification Search
CPC .......... G01R 33/5611; G01R 33/5635; G01R 33/5608; G01R 33/561
USPC ........................ 324/300–322; 382/131–132
See application file for complete search history.

(56) References Cited

U.S. PATENT DOCUMENTS

| | | | |
|---|---|---|---|
| 8,111,893 B2* | 2/2012 | Chen et al. ..................... | 382/131 |
| 2008/0197844 A1* | 8/2008 | Ying et al. ..................... | 324/309 |
| 2008/0199063 A1* | 8/2008 | O'Halloran et al. .......... | 382/131 |
| 2008/0292167 A1 | 11/2008 | Todd et al. | |
| 2010/0054394 A1* | 3/2010 | Thibault ............... | G06T 11/006 378/8 |
| 2013/0099786 A1* | 4/2013 | Huang et al. ................... | 324/309 |
| 2014/0009156 A1* | 1/2014 | Doneva et al. ................. | 324/309 |

OTHER PUBLICATIONS

R.H. Heidemann et al.: Fast method for 1D non-cartesian parallel imaging using GRAPPA. In: Magn. Reson. Med., 57, 2007, S. 1037-1046; Magazine.
X. Jiang, Iterative reconstruction method for three-dimensional non-Cartesian parallel MRI, Dissertation, University of Iowa, USA, May 2011; URL; http://ir.uiowa/edu/etd/991/;Others;2011.
German Office Action for German Application No. DE 10 2011 081 413.2 (Not Yet Published).
German Priority Document for German Application No. DE 10 2011 081 413.2 (Not Yet Published).

* cited by examiner

*Primary Examiner* — Melissa Koval
*Assistant Examiner* — Rishi Patel
(74) *Attorney, Agent, or Firm* — Harness, Dickey & Pierce, P.L.C.

(57) ABSTRACT

A method is disclosed for calculating an MR image of a target layer from an examination object, wherein the MR image is calculated using iterative reconstruction. In at least one embodiment, the method includes: acquiring MR data from an initial layer of the examination object, determining information produced by the examination object from the acquired MR data of the initial layer, determining a penalty term from the information produced by the examination object, and performing the iterative reconstruction of the MR image for the target layer taking into account the determined penalty term.

20 Claims, 4 Drawing Sheets

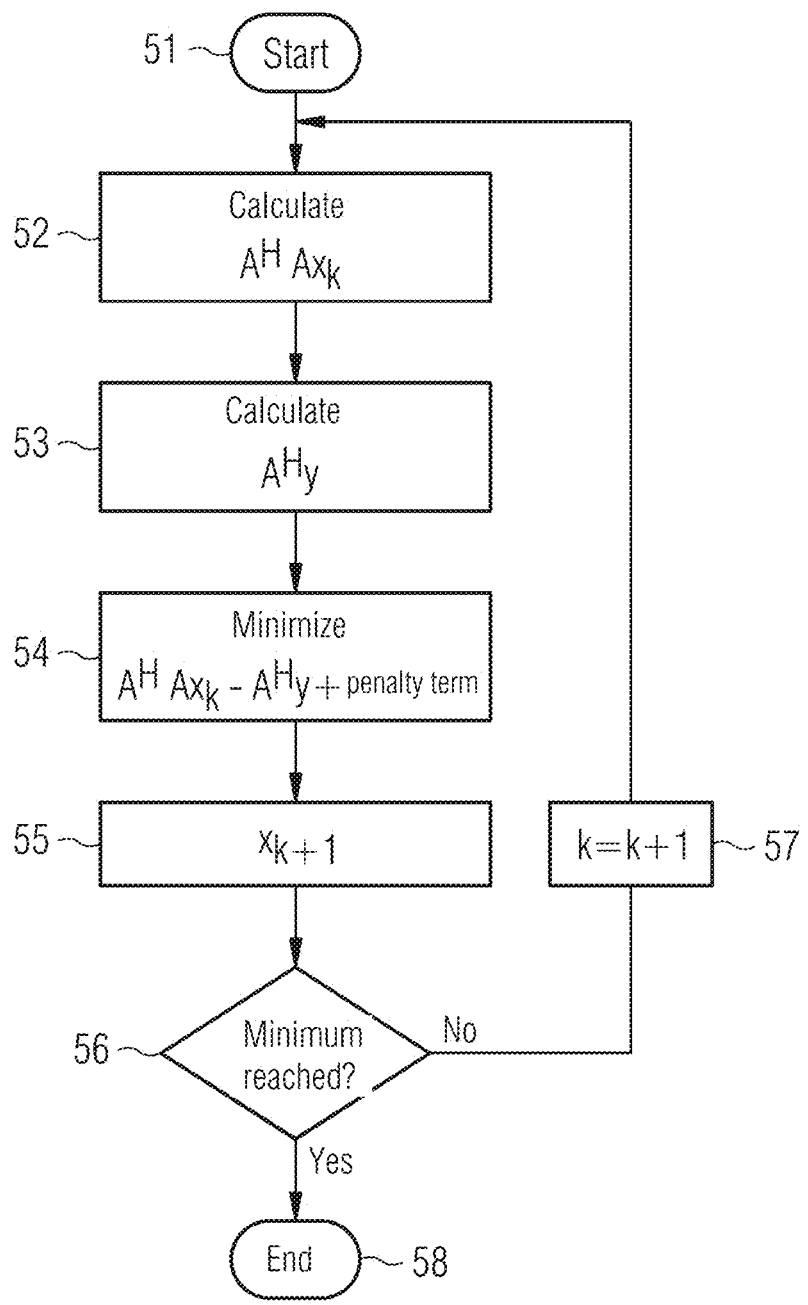

ITERATIVE RECONSTRUCTION METHOD WITH PENALTY TERMS FROM EXAMINATION OBJECTS

PRIORITY STATEMENT

The present application hereby claims priority under 35 U.S.C. §119 to German patent application number DE 10 2011 081 413.2 filed Aug. 23, 2011, the entire contents of which are hereby incorporated herein by reference.

FIELD

At least one embodiment of the present invention generally relates to a method for calculating an MR image, which is calculated using an iterative reconstruction method and/or an MR system for this purpose.

BACKGROUND

In MR imaging parallel imaging techniques and iterative reconstruction methods have produced very promising methods, which allow the recording time for producing an MR image to be reduced or a higher spatial resolution to be achieved for the same recording time. The main objective is generally to reconstruct the "best" possible MR images from undersampled MR data, in other words to reconstruct the MR images without filling the associated raw data space or k space completely with MR data. The problems that occur with such methods are generally what are known as aliasing artifacts or slow convergence rates during iterative reconstruction, generally resulting in long reconstruction times.

With iterative reconstruction methods the missing MR data that has not been recorded is supplemented by prior knowledge of the expected image. This prior knowledge feeds into the optimization by means of so-called regularization terms or penalty terms performed during the reconstruction method. With such iteration methods only generic assumptions are made about the MR images to be reconstructed. Information tailored to the specific examination object is not used. The generic assumptions generally made about the image to be reconstructed can for example include general information about edges in medical images.

SUMMARY

At least one embodiment of the present invention provides a method for the iterative calculation of MR images, which converges quickly and in which the iteratively reconstructed MR images have few artifacts.

Example embodiments are described in the dependent claims.

According to a first aspect of at least one embodiment of the invention, a method for calculating an MR image of a target layer from an examination object is provided, wherein the MR image is calculated using an iterative reconstruction method. According to one step of the method MR data is acquired from an initial layer of the examination object. In a further step information produced by the examination object is determined from the acquired MR data of the initial layer and a penalty term is calculated from the information produced by the examination object. The iterative reconstruction of the MR image is then performed for the target layer taking into account the determined penalty term. By determining the penalty term from MR data of the examination object it is possible to improve the iterative reconstruction, since information produced by the object is fed in during the iterative reconstruction. Further knowledge of the examination object is therefore available, which can be taken into account during the iterative calculation of the MR image.

BRIEF DESCRIPTION OF THE DRAWINGS

Embodiments of the invention are described in more detail below with reference to the accompanying drawings, in which:

FIG. 5 shows a flow diagram illustrating the minimization during the iterative reconstruction.

DETAILED DESCRIPTION OF THE EXAMPLE EMBODIMENTS

Figure 1:
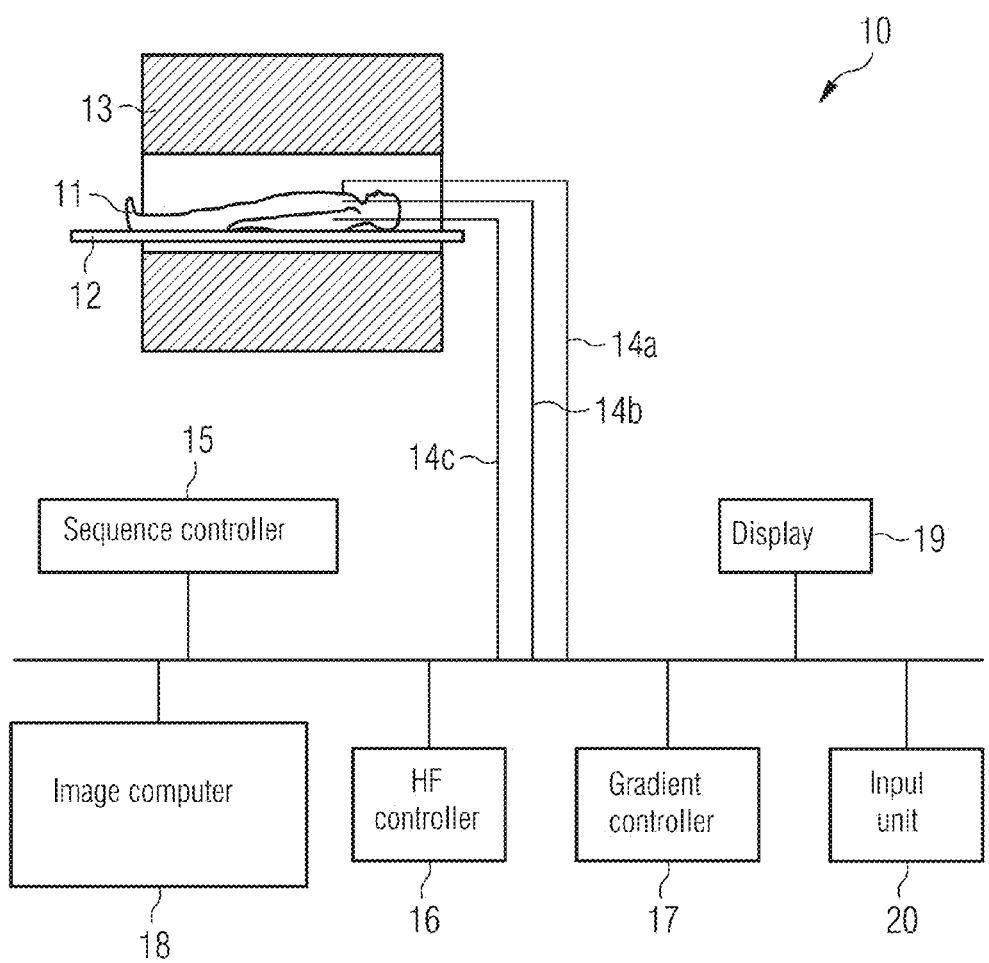
FIG. 1 schematically shows the structure of a magnetic resonance system, with which MR images can be reconstructed using iterative reconstruction methods, which use penalty terms produced by the object.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

According to a first aspect of at least one embodiment of the invention, a method for calculating an MR image of a target layer from an examination object is provided, wherein the MR image is calculated using an iterative reconstruction method. According to one step of the method MR data is acquired from an initial layer of the examination object. In a further step information produced by the examination object is determined from the acquired MR data of the initial layer and a penalty term is calculated from the information produced by the examination object. The iterative reconstruction of the MR image is then performed for the target layer taking into account the determined penalty term. By determining the penalty term from MR data of the examination object it is possible to improve the iterative reconstruction, since information produced by the object is fed in during the iterative reconstruction. Further knowledge of the examination object is therefore available, which can be taken into account during the iterative calculation of the MR image.

The iterative reconstruction preferably has a minimization step, in which a difference between measured MR signals from a target layer and data resulting from a product of the MR image to be calculated in the iteration and a reconstruction matrix A is minimized, with the determined penalty term being taken into account during the minimization.

The iteratively calculated MR image is preferably an angiography image and the information produced by the examination is information about the position and/or extension of blood vessels in the target layer. In angiography images the information represented spatially in the angiography image is generally concentrated on a very small proportion of the image points, specifically the image points representing blood vessels, while the other image points have no or only very little signal intensity. Such information can be taken into account during the iterative reconstruction. Also when producing angiography image data it is possible to make use of the knowledge that blood vessels, particularly in the extremities of the body, only change direction and position to a very minor degree. When the direction and/or extension of the blood vessels is determined in the (freely selectable) initial layer of the examination object, it is possible with the aid of the penalty term to take account of the probability as to where in the examination object the blood vessel will run in the target layer. In this example the information produced by the examination object can include the identification of the blood vessels in an MR image produced from the acquired MR data of the initial layer. If the position of a blood vessel in the initial layer is known, it is possible to take account of the position and/or extension of the blood vessels in the target layer by means of the penalty term based on the blood vessel continuity assumption. Larger deviations between the position of the blood vessels in the initial layer and the position in the target layer can in particular be penalized.

For example in the minimization step the penalty term can be added additively as a further term to the difference, which is minimized. This means that the difference plus the penalty term, which contains the information produced by the object, is generally minimized.

The penalty term can be based for example on a Gaussian normal distribution, with the Gaussian normal distribution here describing the probability of the position of the blood vessels in the target layer based on the determined position in the initial layer. The Gaussian normal distribution here can parameterize information about the direction of propagation of the blood vessels and the brightness of the blood vessels in the MR angiography image. Of course a probability distribution other than a Gaussian normal distribution can also be used for the position of the blood vessels. Similarly the Gaussian normal distribution with its parameters can be tailored to the examination object and the position of the examination object in the body of the examined person.

The data of the initial layer can be determined with the aid of MR measurements, in which the entire associated raw data space is not recorded, just a part, in other words there is undersampling of the associated raw data space.

The last reconstructed layer in each instance serves as the initial layer for the next layer to be reconstructed. The information about the initial object is thus likewise calculated in already undersampled and iteratively reconstructed layers. Undersampling can be selected here so that only 5% to 20% of the associated raw data space is sampled to determine the vessel information in the initial layer. The very first layer can have a low undersampling factor, e.g. 25%. In other words only 25% of the possible k-space points are recorded. Later, when the second layer becomes the initial layer for the third layer, higher factors can also be used (e.g. 5%).

In one embodiment MR images of the examination object can be recorded in a number of parallel layers, with each kth layer from the examination object forming a reference layer. In this reference layer the undersampling factor is generally lower, with for example 50% of the data being recorded. For example k can have a value between 5 and 15. The images of a target layer calculated during the iterative reconstruction method are then compared with an MR image from a reference layer, preferably the reference layer closest to the target layer. This allows the information in the penalty term to be tailored more closely to conditions in the examination object, as the information produced by the examination object is closer to the target layer. A further embodiment provides for the comparison with two reference layers, one before the target layer and one after the target layer.

It is also possible during minimization to take account of a further penalty term, which takes account of coil sensitivity maps of the receive coils used to detect the MR signals. The coil sensitivity maps can in turn be obtained from MR data, with which the entire associated raw data space is not filled with MR signals, just a central part of the associated raw data space. These coil sensitivity maps can be acquired with separate measurements for example.

The MR data of the target layer, for which the MR image is to be iteratively reconstructed, is preferably a result of a subtraction of two MR images. This focuses the spatial intensity distribution in the MR image to be reconstructed significantly on certain regions of the image and other image regions have as good as no intensity. In such differential images only a few spatially precisely located image points have greater intensities. This information can be taken into account as a penalty term when the MR image of the target layer is iteratively reconstructed.

At least one embodiment of the invention also generally relates to a magnetic resonance system for calculating the MR image from the target layer using an iterative reconstruction method, the MR system having an MR sequence control unit, which is configured to acquire MR data from an initial layer of the examination object and from a target layer of the examination object. An image computer unit is also provided, which is able to determine information produced by the examination object from the acquired MR data of the initial layer and a penalty term from the information produced by the examination object. The image computer unit also calculates an iterative reconstruction of the MR image for the target layer taking into account the determined penalty term.

The MR image for the target layer is preferably iteratively reconstructed using MR signals from the target layer, in which the associated raw data space is not completely filled with MR data.

FIG. 1 schematically shows an MR system 10, with which MR images can be recorded of an examination object 11 disposed on a couch 12. The magnetization produced by a magnet 13 is spatially encoded and deflected by switching magnetic field gradients and HF pulses, with the MR signals being detected using a number of MR signal coils 14a to 14c, which are disposed around the examination object 11. For clearer illustration, only the signal lines going out from the individual receive coils are marked 14a to 14c. A sequence control unit 15 controls the switching of the magnetic field gradients, the HF pulses and the signal read-out as a function of the selected imaging sequence and determines the sequence for gradient switching, the irradiation of the HF pulses and the signal read-out. The sequence controller 15 controls an HF control unit 16, which is in turn responsible for controlling the irradiated high-frequency pulses. A gradient controller 17 is responsible for switching the magnetic field gradients, which are predefined by the sequence controller 15. An image computation unit 18 uses the MR signals detected by the coils 14a to 14c to calculate an MR image, with the MR images in the present instance being reconstructed using iterative reconstruction methods, as described in more detail below. The MR images produced by the image computation unit 18 can be displayed on a display 19. An operator can use an input unit 20 to control the MR system 10. The manner in which the sequence of magnetic field gradients and the irradiation of HF pulses can be used to detect MR signals is known to the person skilled in the art and is not explained in further detail here.

Figure 2:
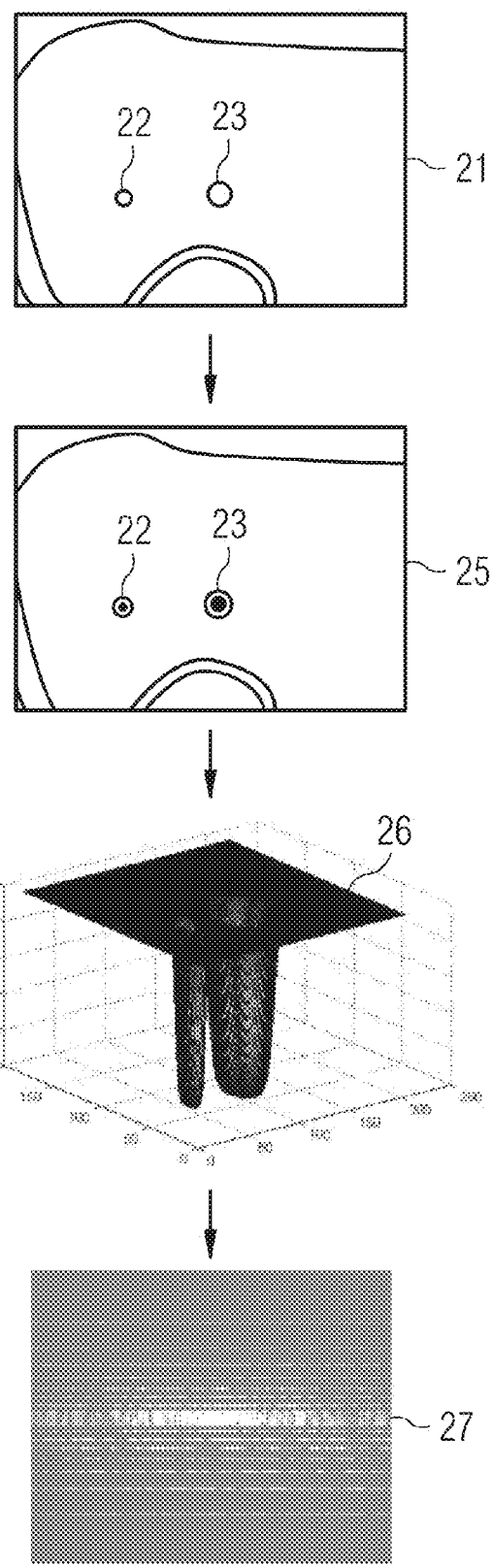
FIG. 2 shows a sequence of steps to take account of information produced by the object during the iteration.

It will now be explained in more detail in conjunction with FIG. 2 how in the context of iterative reconstruction methods a penalty term is incorporated, by way of which assumptions relating to the continuity of the blood vessels are fed in. To this end MR data of an initial layer is acquired. The MR image shown in FIG. 2 is an MR angiography image 21, showing two vessels 22 and 23. This MR image of the initial layer in the examination object can be produced for example by only acquiring central k-space lines from the initial layer during signal detection. Acquisition of the data can take place using a number of receive coils 14A-14C at the same time, as shown schematically in FIG. 1. From the MR image it is now possible to determine information produced by an examination object in the initial layer. This is shown in the MR image 25, in which the MR image 21 has been segmented using segmenting algorithms, to identify the blood vessels 22 and 23. In the segmented MR image 25 the blood vessels identified by segmentation are again emphasized.

The equation used for general image reconstruction is as follows:

$$y=Ax, \quad (1)$$

where y is the measured MR signals, A is a reconstruction matrix and contains for example the Fourier coefficients and x is the desired MR image. The desired MR image x can be mapped in the normal manner by way of an inverse Fourier transform.

With the parallel imaging methods used here additional spatial information is also provided, which changes the above equation by introducing a projection matrix P and also taking into account the coil characteristics or coil sensitivity maps C. This means that the reconstruction matrix A also contains this additional information in addition to Fourier coefficients.

The image reconstruction is formulated as a linear system:

$$y=Ax \quad (2)$$

In certain instances the above equation (2) can be resolved directly. For example by inverting the matrix A by means of the pseudoinverse matrix.

If, to shorten the measuring time, only a small part of the raw data space is recorded, the above equation (2) can no longer be resolved directly, so iterative reconstruction methods come into play. This means that instead of a direct inversion a minimization problem is resolved with the following equation:

$$\min_x \|Ax - y\| \quad (3)$$

One solution for such a minimization problem can be found if additional information about the MR image to be reconstructed is taken into account in a penalty term G(x). The minimization problem then appears as follows:

$$\min_x \{\|Ax - y\| + \lambda \|G(x)\|\} \quad (4)$$

According to an embodiment of the invention this penalty term G(x) now contains information produced by the examination object from the acquired MR data of the examination object. Such information produced by the examination object can be obtained from any layer of the examination object, then referred to as the initial layer. When applied to the example in FIG. 2, this means that the position of the vessels in the initial layer is acquired and a penalty term is then calculated, which contains a probability for the position of the vessel in the target layer. FIG. 2 shows the penalty term 26 for the different layers of the examination object schematically. The penalty term can be based on a function, such as for example a Gaussian normal distribution, which describes the probability of the position of the blood vessels in the different target layers. The construction shown as a penalty term 26 is a reciprocal value of the probability. This means that as the distance from the detected vessel in the initial layer shown at the top increases, the probability decreases that the blood vessel is contained in the target layer in the lower volume shown. This penalty term, referred to as G(x) in the above equation (8), is then applied to the measured raw data 27 of a target layer.

The detected position of the vessels, their intensity, orientation and further characterizing information are also included here as parameters in the calculation of the penalty term. For example when using a normal distribution the size of the vessel in the plane is fed into the standard deviation. As can be seen schematically from the measured raw data 27 of the target layer, not all the associated raw data space is recorded in the target layer, just a part of the raw data space. For example in a central region of the raw data space said region can be recorded homogeneously with a constant density of k-space lines, while in an outer raw data region the distance between the recorded raw data lines increases in an outward direction.

Figure 3:
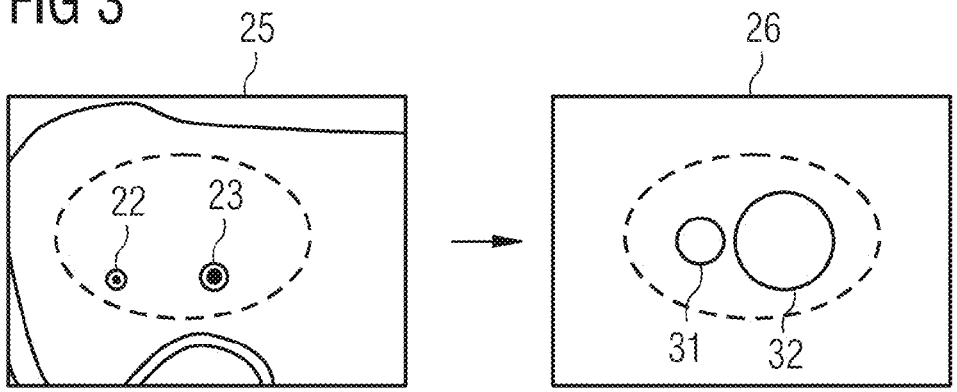
FIG. 3 shows the application of the method to blood vessels with identified blood vessels and the associated penalty term.

FIG. 3 again shows the segmented MR image 25 with the two identified vessels. The right image in FIG. 3 shows the penalty term 26 in two dimensions at the level of the target layer, which means that in the target layer the vessels are very probably present in the regions 31 and 32 and not outside them. In the two-dimensional illustration of the penalty term the size of the function can be color coded for example. This produces the penalty term 26 in FIG. 3.

The initial layer and the target layers here can be either spatially or temporally adjacent.

The additionally used prior knowledge of image content allows the optimization to be performed in a more purposeful manner, so the search for the correct search direction and the correct step length are more specific. This means that the iteration method converges more quickly in the optimization step. Also the so-called aliasing artifacts resulting from the sampling rate using the Nyquist criterion are reduced. As a result higher undersampling factors can be selected, thereby accelerating data acquisition overall.

Figure 4:
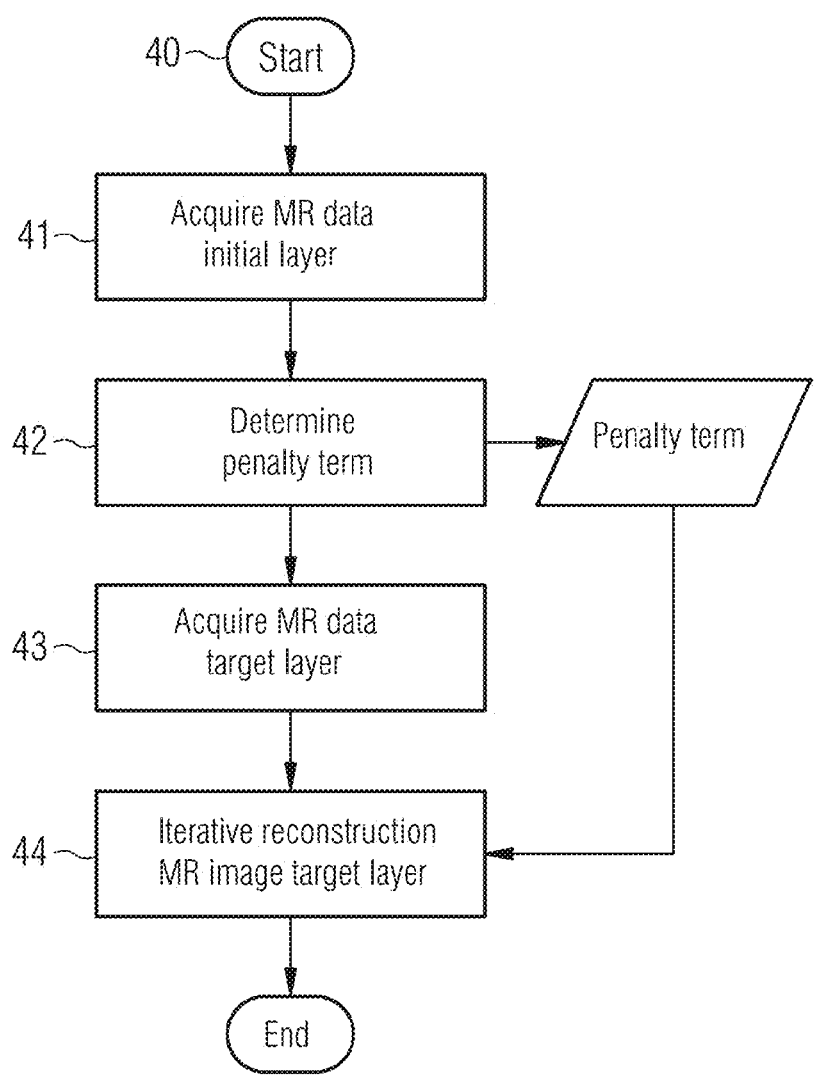
FIG. 4 shows a flow diagram to determine the iterative reconstruction of the MR image.

FIG. 4 summarizes the method for the iterative calculation of the MR image in a target layer. After the start of the method in step 40, in step 41 the MR data of the initial layer is acquired. This MR data of the initial layer can in turn be acquired by not sampling the associated raw data space completely. If the determination of an MR angiography image is involved, step 41 can include the acquisition of two different MR images with the formation of the differential image as the initial image, as known to the person skilled in the art, when an angiography image, with or without the use of contrast agent, is to be produced. The MR image of the initial layer acquired in step 41 can be for example the MR image 21 shown in FIG. 2. The penalty term is then acquired in a step 42. This is done by determining the position of the blood vessels in the initial layer, for example by segmentation. From this position of the blood vessels in the initial layer it is then possible to determine the penalty term. The penalty term data thus determined, for example the penalty term 26 in FIG. 2, is used later during the iterative reconstruction of an MR image of a target layer. In a step 43 undersampled MR data of a target layer is acquired, for example using parallel imaging methods and a number of receive coils. Then in step 44 an iterative reconstruction of the MR image of the target layer takes place taking account of the penalty term calculated in step 42. The method ends in step 45.

FIG. 5 again shows a detailed illustration of the possible iterative reconstruction step 44. The iteration method starts in step 51 and in step 52 AHAxk is calculated, where H is the hermetic matrix of the reconstruction matrix A, which as in equation (2) contains specified information about the coil sensitivities of the individual coils and spatial information. In a step 53 AHy is calculated and in a step 54 the difference is minimized.

In this step 54, as specified in equation (8), the penalty term is taken into account as a further element. This results in step 55 in a reconstructed image for the next iteration step. In step 56 it is checked whether the minimization was successful. In this process the differential images can be considered for example or a maximum number of iteration steps can be given as an upper limit. If the iteration method has not ended, the iteration variable is raised and a new iteration step is performed (step 57). The method ends in step 58, if it has been detected in step 56 that the minimization should be terminated.

It is also possible, during the recording of a number of parallel layers, for each kth layer where k is between 5 and 20 to form a reference, it being possible to compare the iterative results of the previous measurements with the spatially next reference layer. The undersampling for these reference layers is smaller than for the other iteratively calculated data. For example 50% of the k-space data or more can be acquired. During the reconstruction of a number of layers for example the fifth layer can be a reference layer, with layer 4 being iteratively reconstructed. This can then be compared with layer 5, the reference layer, which was reconstructed without the use of the penalty term. The result for layer 4 can then be adjusted if necessary, with layer 5 in turn forming the initial layer for the reconstruction of layer 6 and layer 6 being the target layer. It is likewise possible to use reference layers from both sides. Then for example layer 5 and layer 10 can be the reference layers, in other words both of these are reconstructed without the use of a penalty term. For the reconstruction of layer 6 layers 5 and 10 can be initial layers with layer 6 as the target layer. The two initial layers can be included with different weightings as a function of the different spatial position or different time, at which layers 5 and 10 were recorded in relation to layer 6.

In another embodiment it is possible for a number of layers to be initial layers, with the result that the information about the position of the vessels, the size and pattern of the vessels and any bifurcations and the growth of the vessels is included. This allows the penalty term to describe the position and pattern of the vessels in the initial layers even more accurately.

It is likewise possible for not just one initial layer but a number of initial layers to be used, it being possible to obtain the blood vessel information, such as for example a diameter change, a direction deviation or information about a bifurcation of a blood vessel, from this number of initial layers. This information is then fed into the calculation of the penalty term. In addition to the penalty term relating to the position of the blood vessels, it is also possible to use a penalty term which contains information about the coil sensitivity maps used to acquire the MR data. A possible solution for the iteration can be a quasi-Newton solution algorithm or even a different optimization method.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for calculating an MR image of a target layer from an examination object, wherein the MR image is calculated using iterative reconstruction, the method comprising:
   acquiring MR data from an initial layer of the examination object, the initial layer differing spatially from the target layer;
   determining information produced by the examination object from the acquired MR data of the initial layer;
   determining a penalty term from the determined information produced by the examination object; and
   performing the iterative reconstruction of the MR image for the target layer, taking into account the determined penalty term.

2. The method of claim 1, wherein the iterative reconstruction includes a minimization step, in which a difference between measured MR signals from the target layer and data resulting from a product of the MR image to be calculated in the iteration and a reconstruction matrix A is minimized, with the determined penalty term being taken into account during the minimization.

3. The method of claim 1, wherein the iteratively calculated MR image is an MR angiography image and the information produced by the examination object includes information about at least one of a position and extension of blood vessels in the target layer.

4. The method of claim 3, wherein the information produced by the examination object includes an identification of the blood vessels in an MR image, produced from the acquired MR data of the initial layer.

5. The method of claim 2, wherein, in the minimization step, the penalty term is added additively as a further term to the function to be minimized.

6. The method of claim 5, wherein the penalty term is based on a Gaussian normal distribution, which describes the probability of the position of the blood vessels in the target layer.

7. The method of claim 6, wherein the penalty term parameterizes information about the direction of propagation of the blood vessels and the brightness of the blood vessels in the MR angiography image.

8. The method of claim 1, wherein MR images of a number of parallel layers of the examination object are recorded, with each kth layer, where k is between 5 and 20, from the examination object forming a reference layer, with the images of the target layer calculated using the iterative reconstruction method being compared with the MR image from a reference layer.

9. The method of claim 2, wherein, during the minimization, a further penalty term is taken into account, which takes account of coil sensitivity maps of the receive coils used to acquire the MR signals.

10. The method of claim 9, wherein, in the reference layer, a raw data space associated with the reference layer is undersampled to a lesser degree than in the target layer.

11. The method of claim 10, wherein the coil sensitivity maps are obtained from MR signals, with which an entire associated raw data space is not filled with MR signals, just a central part of the associated raw data space.

12. The method of claim 1, wherein the MR image reconstructed using the iterative reconstruction method is a differential image of 2 MR images.

13. The method of claim 1, wherein, for the iterative reconstruction, MR data from the target layer is recorded, with the MR data of the target layer not filling an associated raw data space completely.

14. The method of claim 1, wherein the penalty term is determined by acquiring MR data from a number of initial layers.

15. A magnetic resonance system for calculating an MR image of a target layer from an examination object, wherein the MR image is calculated using iterative reconstruction, the magnetic resonance system comprising:
   an MR sequence control unit, configured to acquire MR data from an initial layer of the examination object, the initial layer differing spatially from the target layer; and
   an image computation unit, configured to
      determine information produced by the examination object from the acquired MR data of the initial layer,
      determine a penalty term from the information produced by the examination object, and
      perform the iterative reconstruction of the MR image for the target layer, taking into account the determined penalty term.

16. The method of claim 2, wherein the iteratively calculated MR image is an MR angiography image and the information produced by the examination object includes information about at least one of a position and extension of blood vessels in the target layer.

17. The method of claim 16, wherein the information produced by the examination object includes an identification of the blood vessels in an MR image, produced from the acquired MR data of the initial layer.

18. The method of claim 17, wherein, in the minimization step, the penalty term is added additively as a further term to the function to be minimized.

19. A method for calculating an MR image of a target layer from an examination object, wherein the MR image is calculated using iterative reconstruction, the method comprising:
   acquiring MR data from an initial layer of the examination object;
   determining information produced by the examination object from the acquired MR data of the initial layer;
   determining a penalty term from the determined information produced by the examination object; and
   performing the iterative reconstruction of the MR image for the target layer, taking into account the determined penalty term, wherein the penalty term is based on a Gaussian normal distribution, which describes the probability of a position of blood vessels in the target layer.

20. A non-transitory computer readable medium including program segments for, when executed on a computer device, causing the computer device to implement the method of claim 1.

* * * * *